United States Patent
Hu et al.

(10) Patent No.: US 8,022,308 B2
(45) Date of Patent: Sep. 20, 2011

(54) WIRED CIRCUIT BOARD AND ELECTRONIC DEVICE

(75) Inventors: Szu-Han Hu, Osaka (JP); Voon Yee Ho, Osaka (JP); Hiroshi Yamazaki, Osaka (JP); Martin John McCaslin, Fremont, CA (US)

(73) Assignee: Nitto Denko Corporation, Osaka (JP)

( * ) Notice: Subject to any disclaimer, the term of this patent is extended or adjusted under 35 U.S.C. 154(b) by 201 days.

(21) Appl. No.: 11/902,553

(22) Filed: Sep. 24, 2007

(65) Prior Publication Data

US 2008/0078573 A1    Apr. 3, 2008

(30) Foreign Application Priority Data

Oct. 2, 2006   (JP) .................................. 2006-271035

(51) Int. Cl.
    *H05K 1/00*   (2006.01)
(52) U.S. Cl. ...................... 174/254; 361/749; 361/752
(58) Field of Classification Search .................. 174/254, 174/117 F, 117 FF; 361/749
    See application file for complete search history.

(56) References Cited

U.S. PATENT DOCUMENTS

| 4,926,007 | A | | 5/1990 | Aufderheide et al. |
| 5,163,835 | A | * | 11/1992 | Morlion et al. ................. 439/67 |
| 5,828,555 | A | | 10/1998 | Itoh |
| 5,967,854 | A | * | 10/1999 | Craig ............................ 439/676 |
| 6,353,189 | B1 | | 3/2002 | Shimada et al. |
| 7,466,558 | B2 | | 12/2008 | Yasuda |
| 7,531,752 | B2 | | 5/2009 | Hirakata |
| 2003/0188889 | A1 | | 10/2003 | Straub et al. |
| 2006/0033832 | A1 | | 2/2006 | Shin |
| 2006/0194462 | A1 | | 8/2006 | Hashizume |

FOREIGN PATENT DOCUMENTS

| CN | 1728774 | 2/2006 |
| GB | 2274946 | 8/1994 |
| JP | 02224398 | 9/1990 |
| JP | 6-70267 | 9/1994 |
| JP | 07-106787 | 4/1995 |
| JP | 10-41630 | 2/1998 |
| JP | 2001-284743 | 10/2001 |
| JP | 2003-130191 | 5/2003 |
| JP | 2005-184344 | 7/2005 |
| JP | 2006-041193 | 2/2006 |

OTHER PUBLICATIONS

Notification of Reasons for Refusal issued on Jul. 26, 2011.

\* cited by examiner

*Primary Examiner* — Ishwarbhai B Patel

(74) *Attorney, Agent, or Firm* — Jean C. Edwards, Esq.; Edwards Neils PLLC

(57) ABSTRACT

A wired circuit board has an insulating layer extending in a longitudinal direction, a conductive layer having a plurality of signal wirings covered with the insulating layer and arranged in mutually spaced-apart and parallel relation in a perpendicular direction to the longitudinal direction and a thickness direction of the insulating layer, and connecting terminals provided on both longitudinal ends of each of the signal wirings and exposed from the insulating layer, and a ground layer covered with the insulating layer and formed to surround each of the signal wirings in a perpendicular direction to the longitudinal direction. A slit along the longitudinal direction is formed between each of the signal wirings in the insulating layer.

6 Claims, 9 Drawing Sheets

(a)

(b)

(c)

(d)

(e)

(f)

(a)

(b)

(c)

(d)

(e)

(f)

(g)

WIRED CIRCUIT BOARD AND ELECTRONIC DEVICE

CROSS-REFERENCE TO RELATED APPLICATION

The present application claims priority from Japanese Patent Application No. 2006-271035 filed on Oct. 2, 2006, the contents of which are herein incorporated by reference in their entirety.

BACKGROUND OF THE INVENTION

1. Field of the Invention

The present invention relates to a wired circuit board and an electronic device and, more particularly, to a wired circuit board such as a flexible wired circuit board and an electronic device using the wired circuit board, such as a cellular phone.

2. Description of the Related Art

Conventionally, flexible wired circuit boards have been used in the movable members of various electronic devices such as a cellular phone, a notebook personal computer, and a video camera.

In recent years, in terms of higher data density, an increase in the frequency of a signal has been required in such a flexible wired circuit board. However, when the frequency of the signal is increased, a transmission loss in a signal wiring increases undesirably.

To reduce such a transmission loss, it has been proposed that, e.g., in a wiring board including a line, a shield pattern disposed generally in parallel with the line, a conductor layer (upper conductor layer) disposed to face each of the line and the shield pattern via an insulating layer (upper insulating layer), a conductor layer (lower conductor layer) disposed to face each of the line and the shield pattern via an insulating layer (lower insulating layer), and conductive pillars connecting the upper conductor layer and the lower conductor layer, a ground potential is supplied to each of the shield pattern, the upper conductor layer, the lower conductor layer, and the conductive pillars which surround the line along an extending direction of the line over 360° around the circumference thereof (see, e.g., U.S. Pat. No. 6,353,189).

It has also been proposed that, e.g., in a connector in which a base shield layer, a base insulating layer, a conductor layer composed of a plurality of conductors, a cover insulating layer, and a cover shield layer are successively laminated, the base shield layer and the cover shield layer continuously surround the conductor layer via the base insulating layer and the cover insulating layer (see, e.g., U.S. Pat. No. 4,926,007).

SUMMARY OF THE INVENTION

On the other hand, in a flexible wired circuit board used in a cellular phone in which an operation portion and a liquid-crystal display portion are connected via a rotation shaft to be relatively rotatable, each of the connecting terminals at both ends in a longitudinal direction is typically connected to an electronic component in the operation portion and to an electronic component in the liquid-crystal display portion, while the longitudinally middle portion of the flexible wired circuit board is wound around the rotation shaft. Accordingly, when the operation portion and the liquid-crystal display portion are relatively rotated around the rotation shaft, the longitudinally middle portion of the flexible circuit board receives a stress to be twisted along the circumferential direction of the rotation shaft and distorted in a widthwise direction. As a result, a signal wiring may be broken under such a stress.

With the wiring board described in U.S. Pat. No. 6,353,189 and the connector described in U.S. Pat. No. 4,926,007, a transmission loss in the conductor layer (line) can be reduced, but it is difficult to prevent a broken line in the conductive layer due to the stress and to reduce the transmission loss at the same time.

It is therefore an object of the present invention to provide a wired circuit board which allows the prevention of a transmission loss in a signal wiring as well as a relief in the stress received when a first casing and a second casing are relatively rotated and an electronic device using the wired circuit board.

A wired circuit board according to the present invention comprises an insulating layer extending in a longitudinal direction, a conductive layer having a plurality of signal wirings covered with the insulating layer and arranged in mutually spaced-apart and parallel relation in a perpendicular direction to the longitudinal direction and a thickness direction of the insulating layer, and connecting terminals provided on both longitudinal ends of each of the signal wirings and exposed from the insulating layer, and a ground layer covered with the insulating layer and formed to surround each of the signal wirings in a perpendicular direction to the longitudinal direction, wherein a slit along the longitudinal direction is formed between each of the signal wirings in the insulating layer.

The wired circuit board comprises the ground layer formed to surround each of the signal wirings in the perpendicular direction to the longitudinal direction. Accordingly, even when a signal transmitted by each of the signal wirings is increased in frequency, the transmission loss in the signal wiring can be reduced. In addition, the slit along the longitudinal direction is formed between the signal wirings in the insulating layer. Therefore, even when the wired circuit board receives a stress that distorts the wired circuit board in the perpendicular direction to the longitudinal direction and to the thickness direction, such a stress can be relieved by the slit. As a result, it is possible to effectively prevent damage such as a broken wiring in the conductive layer due to such a stress to ensure excellent long-term reliability.

In the wired circuit board according to the present invention, it is preferable that the slit is extensively formed adjacent to each of the connecting terminals on one side in the longitudinal direction, and adjacent to each of the connecting terminals on the other side in the longitudinal direction.

In the wired circuit board, the slit is extensively formed adjacent to each of the connecting terminals on one side in the longitudinal direction, and adjacent to each of the connecting terminals on the other side in the longitudinal direction. As a result, it is possible to more reliably relieve the stress mentioned above, while the strength of the entire wired circuit board is secured.

An electronic device according to the present invention comprises a first casing, a second casing connected to the first casing, a connecting member for connecting the first casing and the second casing so as to be relatively rotatable, and a wired circuit board including an insulating layer extending in a longitudinal direction, a conductive layer having a plurality of signal wirings covered with the insulating layer and in mutually spaced-apart and parallel relation in a perpendicular direction to the longitudinal direction and a thickness direction of the insulating layer, and connecting terminals provided on both longitudinal ends of each of the signal wirings and exposed from the insulating layer, and a ground layer covered with the insulating layer and formed to surround each of the signal wirings in a perpendicular direction to the longitudinal direction, the insulating layer being formed with a slit between each of the signal wirings along the longitudinal direction, wherein each of the connecting terminals on one side in a longitudinal direction is connected to an electronic component of the first casing, each of the connecting terminals on the other side in the longitudinal direction is connected to an electronic component of the second casing, and each of the signal wirings is disposed around the connecting member and is arranged parallel along a direction in which the first casing and the second casing relatively rotate.

In the electronic device, each of the signal wirings is disposed around the connecting member and is arranged parallel along a direction in which the first casing and the second casing relatively rotate. As a result, when the first casing and the second casing are relatively rotated by the connecting member, the wired circuit board receives a stress that twists the wired circuit board in the direction in which the first casing and the second casing relatively rotate, i.e., in the direction in which each of the signal wirings is arranged parallel, more specifically in the perpendicular direction to the longitudinal direction and thickness direction of the wired circuit board and distorted in the perpendicular direction to the longitudinal direction and to the thickness direction. However, such a stress can be relieved by the slit. Therefore, it is possible to relatively rotate the first casing and the second casing smoothly by the connecting member and prevent damage such as a broken wiring in the wired circuit board at the connecting member to ensure excellent long-term reliability.

DETAILED DESCRIPTION OF THE INVENTION

Figure 1:
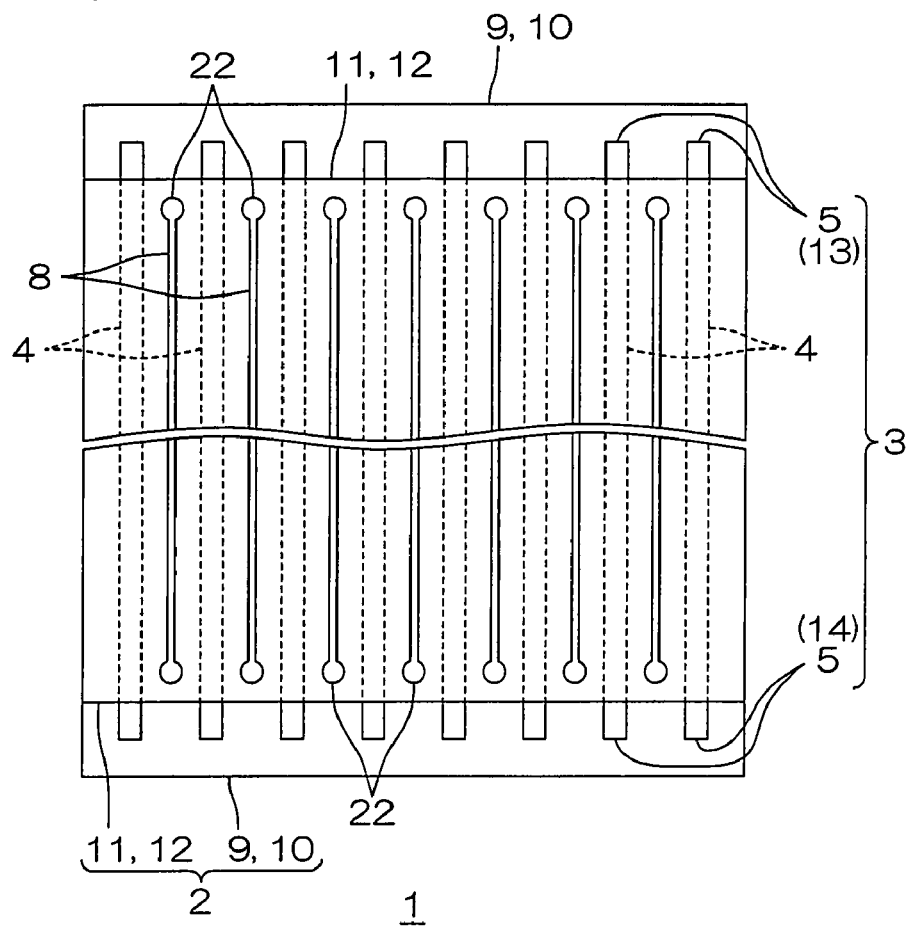
FIG. 1 is a plan view of a wired circuit board according to an embodiment of the present invention.
Figure 2:
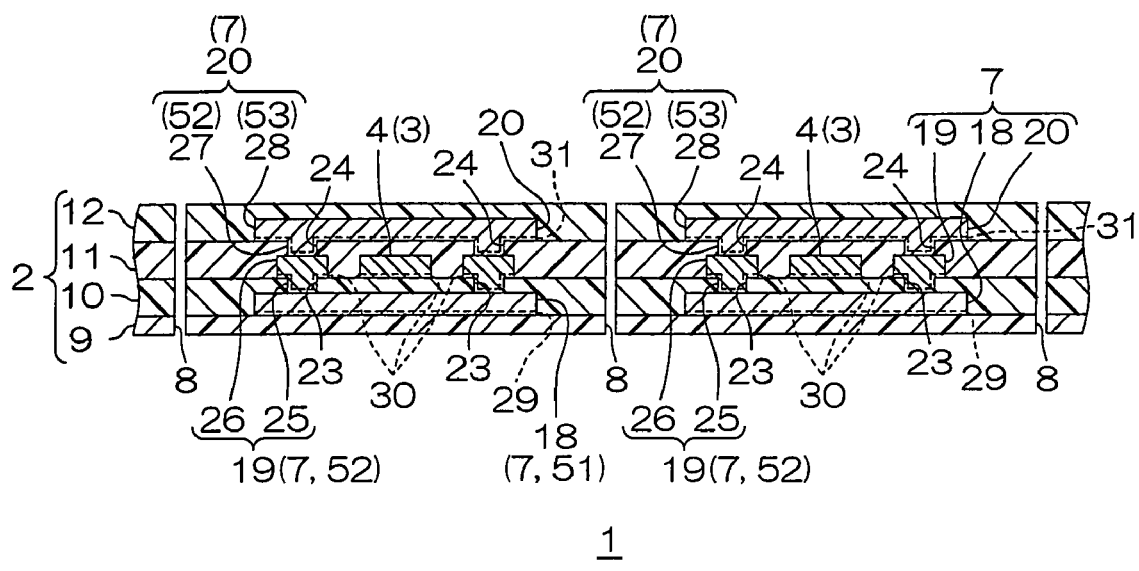
FIG. 2 is a partial cross-sectional view of the longitudinally middle portion of the wired circuit board shown in FIG. 1 in a perpendicular direction to the longitudinal direction of the wired circuit board.

FIG. 1 is a plan view showing a wired circuit board according to an embodiment of the present invention. FIG. 2 is a partial cross-sectional view of the longitudinally middle portion of the wired circuit board shown in FIG. 1 in a perpendicular direction to the longitudinal direction of the wired circuit board (identical to the direction in which signal wirings 4, described later, extend and hereinafter simply referred to as the longitudinal direction). In FIG. 1, ground layers 7, described later, are omitted.

In FIG. 1, a wired circuit board 1 is a flexible wired circuit board formed in, e.g., a generally rectangular shape extending in the longitudinal direction when viewed in plan view. The wired circuit board 1 includes, e.g., an insulating layer 2, a conductive layer 3, and the ground layers 7 (see FIG. 2).

The insulating layer 2 is formed in a generally rectangular shape extending in the longitudinal direction when viewed in plan view to correspond to the outer shape of the wired circuit board 1. As shown in FIG. 2, the insulating layers 2 include a first insulating layer 9, a second insulating layer 10, a third insulating layer 11, and a fourth insulating layer 12. The insulating layer 2 is formed by successively laminating the first insulating layer 9, the second insulating layer 10, the third insulating layer 11, and the fourth insulating layer 12 in a thickness direction.

As shown in FIG. 1, the first insulating layer 9, the second insulating layer 10, the third insulating layer 11, and the fourth insulating layer 12 are formed to have both end edges in the perpendicular direction (hereinafter simply referred to as the widthwise direction) to the longitudinal direction and to the thickness direction placed at the same positions when viewed in plan view.

The first insulating layer 9 and the second insulating layer 10 are formed to have respective both end edges in the longitudinal direction placed at the same positions when viewed in plan view. The third insulating layer 11 and the fourth insulating layer 12 are formed to have respective both end edges in the longitudinal direction placed at the same positions when viewed in plan view.

The third insulating layer 11 and the fourth insulating layer 12 are formed to be slightly shorter in the longitudinal direction than the first insulating layer 9 and the second insulating layer 10. In other words, the third insulating layer 11 and the fourth insulating layer 12 are formed to expose the respective both longitudinal ends of the first insulating layer 9 and the second insulating layer 10 from the both longitudinal end edges of the third insulating layer 11 and the fourth insulating layer 12.

As shown in FIG. 2, the second insulating layer 10 is formed on the first insulating layer 9 to cover first ground layers 18, described later, and have first openings 23 to be filled with the first lower portions 25 of second ground layers 19, described later. More specifically, the second insulating layer 10 is formed on the upper surface of the first insulating layer 9 and on the upper surfaces (except for the portions in which the first openings 23 are formed) and both widthwise side surfaces of the first ground layers 18.

The first openings 23 are formed in the second insulating layer 10 at the both widthwise ends of each of the first ground layers 18 described later to penetrate the second insulating layer 10 in the thickness direction and extend in the longitudinal direction.

The third insulating layer 11 is formed to cover the conductive layer 3 and the second ground layers 19, described later, and have second openings 24 to be filled with the second lower portions 27 of third ground layers 20, described later. More specifically, the third insulating layer 11 is formed on the upper surface of the second insulating layer 10, on the upper surface and both widthwise side surfaces of the signal wirings 4, described later, and on the upper surfaces (except for the portions in which the second openings 24 are formed) and both widthwise side surfaces of the upper portions 26 of the second ground layers 19.

The second openings 24 are formed in the third insulating layer 11 over the second ground layers 19 to penetrate the third insulating layer 11 in the thickness direction and extend in the longitudinal direction.

The fourth insulating layer 12 is formed on the third insulating layer 11 to cover the third ground layers 20. More specifically, the fourth insulating layer 12 is formed on the upper surface of the third insulating layer 11 and on the upper surfaces and both widthwise side surfaces of the third ground layers 20.

The first insulating layer 9, the second insulating layer 10, the third insulating layer 11, and the fourth insulating layer 12 are made of the same insulating material or different insulating materials. For example, the first insulating layer 9, the second insulating layer 10, the third insulating layer 11, and the fourth insulating layer 12 are made of synthetic resins (e.g., photosensitive synthetic resins when the first insulating layer 9, the second insulating layer 10, the third insulating layer 11, and the fourth insulating layer 12 are formed in a pattern in a production method described later) such as polyimide, polyether nitrile, polyether sulfone, polyethylene terephthalate, polyethylene naphthalate, and polyvinyl chloride. Preferably, the first insulating layer 9, the second insulating layer 10, the third insulating layer 11, and the fourth insulating layer 12 are made of polyimide.

The thickness of the first insulating layer 9 is in the range of, e.g., 3 to 25 μm, or preferably 5 to 12.5 μm. The thickness of the second insulating layer 10 is in the range of, e.g., 5 to 25 μm, or preferably 10 to 20 μm. The thickness of the third insulating layer 11 is in the range of, e.g., 5 to 25 μm, or preferably 10 to 20 μm. The thickness of the fourth insulating layer 12 is in the range of, e.g., 5 to 25 μm, or preferably 10 to 20 μm.

The conductive layer 3 is formed on the second insulating layer 10, more specifically, on the upper surface of the second insulating layer 10. The conductive layer 3 is formed in a wired circuit pattern integrally having the plurality of signal wirings 4 extending in the longitudinal direction and arranged in mutually spaced-apart and parallel relation in the widthwise direction and connecting terminals 5 provided at the respective both longitudinal ends of the signal wirings 4.

The plurality of signal wires 4 are for transmitting electric signals inputted/outputted to and from display-side electronic components of a display-side casing 15 of a cellular phone 6, described later, and operation-side electronic components of an operation-side casing 16 of the cellular phone 6, and are formed to be covered with the third insulating layer 11. The signal wirings 4 connect display-side connecting terminals 13 to operation-side connecting terminals 14, each described next.

As shown in FIG. 1, the connecting terminals 5 are formed to be exposed from the third insulating layer 11 and the fourth insulating layer 12 and include the display-side connecting terminals 13 as connecting terminals on one side in the longitudinal direction and the operation-side connecting terminals 14 as connecting terminals on the other side in the longitudinal direction.

The plurality of display-side connecting terminals 13 are provided on the one longitudinal end of the wired circuit board 1. More specifically, each of the display-side connecting terminals 13 is disposed on the upper surface of the one longitudinal end of the second insulating layer 10 exposed from the one longitudinal end edge of each of the third insulating layer 11 and the fourth insulating layer 12 to be arranged in mutually spaced-apart and parallel relation. To the respective display-side connecting terminals 13, the respective one longitudinal ends of the respective signal wirings 4 are continuously connected. For example, a connectors of the display-side electronic component of the display-side casing 15 of the cellular phone 6 is connected to the display-side connecting terminal 13.

The plurality of operation-side connecting terminals 14 are provided on the other longitudinal end of the wired circuit board 1. More specifically, each of the operation-side connecting terminals 14 is disposed on the upper surface of the other longitudinal end of the second insulating layer 10 exposed from the other longitudinal end edge of each of the third insulating layer 11 and the fourth insulating layer 12. To the respective operation-side connecting terminals 14, the respective other longitudinal ends of the respective signal wirings 4 are continuously connected. For example, a connector of the operation-side electronic component of the operation-side casing 16 of the cellular phone 6 is connected to the operation-side connecting terminals 14.

The conductive layer 3 is made of a conductive material such as copper, nickel, gold, a solder, or an alloy thereof. Preferably, the conductive layer 3 is made of copper.

When the conductive layer 3 is formed by an additive method described later, a second metal thin film 30 is interposed between the conductive layer 3 and the upper surface of the second insulating layer 10, as indicated by the dotted lines in FIG. 2.

The thickness of the conductive layer 3 is in the range of, e.g., 3 to 18 µm, or preferably 5 to 12 µm. The width (widthwise length, hereinafter referred to as such) of each of the signal wirings 4 is in the range of, e.g., 20 to 40 µm, or preferably 20 to 30 µm. The spacing between the individual signal lines 4 is in the range of, e.g., 200 to 800 µm, or preferably 400 to 600 µm. The length (longitudinal length, hereinafter referred to as such) of each of the connecting terminals 5 is in the range of, e.g., 3 to 20 mm, or preferably 5 to 10 mm.

As shown in FIG. 2, the plurality of ground layers 7 are formed to correspond to the respective signal wirings 4 and extend in the longitudinal direction. The respective ground layers 7 are formed to be covered with the insulating layers 2, and to surround the respective signal wirings 4 in the widthwise direction and in the thickness direction.

More specifically, the ground layers 7 include the first ground layers 18, the second ground layers 19, and the third ground layers 20 and are formed by successively laminating the first ground layers 18, the second ground layers 19, and the third ground layers 20 in the thickness direction. The ground layers 7 are connected to the ground (grounded) via ground connecting portions provided on the one longitudinal ends or the other longitudinal ends of the ground layers 7, though not shown.

The first ground layers 18 are formed on the first insulating layer 9, more specifically, on the upper surface of the first insulating layer 9 to be covered with the second insulating layer 10.

The first ground layers 18 are formed also to face at least the signal wirings 4 and the second ground layers 19 in the thickness direction. More specifically, each of the first ground layers 18 is formed to extend to the both widthwise outsides of the corresponding signal wiring 4 and have a width larger than the spacing between the both widthwise outer surfaces (the one widthwise side surface of the second ground layer 19 on one widthwise side and the other widthwise side surface of the second ground layer 19 on the other widthwise side) of the corresponding second ground layers 19, described next.

When the first ground layers 18 are formed by an additive method described later, a first metal thin film 29 is interposed between the first ground layers 18 and the upper surface of the first insulating layer 9, as indicated by the dotted lines in FIG. 2.

The second ground layers 19 are formed on the second insulating layer 10 and the first ground layers 18, more specifically, on the respective upper surfaces of the second insulating layer 10 and the first ground layers 18 to be covered with the third insulating layer 11 and arranged in spaced-apart relation at the both widthwise outsides of the respective signal wirings 4. The second ground layers 19 are arranged to face each other with the corresponding signal wiring 4 interposed therebetween in the widthwise direction. The respective second ground layers 19 integrally and continuously include the first lower portions 25 formed to fill in the first openings 23 of the second insulating layer 10 and the first upper portions 26 formed to protrude from the upper ends of the first lower portions 25 upwardly in the thickness direction and outwardly in both widthwise directions, and to cover the upper surface of the second insulating layer 10 on the widthwise peripheries of the first openings 23.

When the second ground layers 19 are formed by the additive method described later, the second metal thin film 30 is interposed between the second ground layers 19 and each of the upper surfaces of the first ground layers 18 exposed from the first openings 23 of the second insulating layer 10, the inner side surfaces of the first openings 23 of the second insulating layer 10, and the upper surface of the second insulating layer 10 covered with the first upper portions 26 of the second ground layers 19, as indicated by the dotted lines in FIG. 2.

The third ground layers 20 are formed on the second ground layers 19 and the third insulating layer 11, more specifically, on the respective upper surfaces of the second ground layers 19 and the third insulating layer 11 to be covered with the fourth insulating layer 12. The third ground layers 20 are formed also to face at least the signal wirings 4 and the second ground layers 19 in the thickness direction. More specifically, the respective third ground layers 20 are arranged to face the respective first ground layers 18 with the respective signal wirings 4 being interposed therebetween in the thickness direction. In addition, each of the third ground layers 20 is formed to extend to the both widthwise outsides of the corresponding signal wiring 4 and have a width larger than the spacing between the both widthwise outer side surfaces of the corresponding second ground layers 19.

The third ground layers 20 integrally and continuously include the second lower portions 27 formed to fill in the openings 24 of the third insulating layer 11 and second upper portions 28 formed to protrude from the upper ends of the second lower portions 27 upwardly in the thickness direction and outwardly in both widthwise directions, and to cover the upper surface of the third insulating layer 11 between the second openings 24. The second lower portions 27 of the third ground layers 20 are formed to be placed at the same positions as the first lower portions 25 of the second ground layers 19 when viewed in plan view.

When the third ground layers 20 are formed by the additive method described later, a third metal thin film 31 is interposed between the third ground layers 20 and each of the upper surfaces of the second ground layers 19 exposed from the second openings 24 of the third insulating layer 11, the inner side surfaces of the second openings 24 of the third insulating layer 11, and the upper surface of the third insulating layer 11 covered with the second upper portions 28 of the third ground layers 20, as indicated by the dotted lines in FIG. 2.

The first metal thin film 29, the second metal thin film 30, and the third metal thin film 31 are made of the same metal material or different metal materials. For example, the first metal thin film 29, the second metal thin film 30, and the third metal thin film 31 are made of copper, chromium, gold, silver, platinum, nickel, titanium, silicon, manganese, zirconium, an alloy thereof, or an oxide thereof. Preferably, the first metal thin film 29, the second metal thin film 30, and the third metal thin film 31 are made of copper and chromium. The thickness of each of the first metal thin film 29, the second metal thin film 30, and the third metal thin film 31 is in the range of, e.g., 0.01 to 1 µm, or preferably 0.01 to 0.1 µm.

The first ground layers 18, the second ground layers 19, and the third ground layers 20 are made of the same metal material or different metal materials. For example, the first ground layers 18, the second ground layers 19, and the third ground layers 20 are made of the same metal material as the conductive material of the conductive layer 3. Preferably, the first ground layers 18, the second ground layers 19, and the third ground layers 20 are made of copper.

The thickness of each of the first ground layers 18 is in the range of, e.g., 3 to 18 µm, or preferably 5 to 12 µm. The width of each of the first ground layers 18 is in the range of, e.g., 150 to 500 µm, or preferably 220 to 430 µm. The spacing between the individual first ground layers 18 is in the range of 80 to 300 µm, or preferably 100 to 200 µm The thickness of the first upper portion 26 of each of the second ground layers 19 is in the range of, e.g., 3 to 18 µm, or preferably 5 to 12 µm. The width of the first upper portion 26 of each of the second ground layers 19 is in the range of, e.g., 25 to 200 µm, or preferably 50 to 150 µm. The thickness of the first lower portion 25 of each of the second ground layers 19 is in the range of, e.g., 2 to 22 µm, or preferably 5 to 15 µm. The width of the first lower portion 25 of each of the second ground layers 19 is in the range of, e.g., 10 to 100 µm, or preferably 20 to 50 µm.

The spacing between the first upper portion 26 of each of the second ground layers 19 and the signal wiring 4 adjacent thereto is in the range of, e.g., 50 to 150 µm, or preferably 75 to 130 µm.

The thickness of the second upper portion 28 of each of the third ground layers 20 is in the range of, e.g., 3 to 18 µm, or preferably 5 to 12 µm. The width of the second upper portion 28 of each of the third ground layers 20 is in the range of, e.g., 150 to 500 µm, or preferably 220 to 430 µm. The thickness of the second lower portion 27 of each of the third ground layers 20 is in the range of, e.g., 2 to 22 µm, or preferably 5 to 15 µm. The spacing between the individual third ground layers 20 (the second upper portions 28) is in the range of, e.g., 80 to 300 µm, or preferably 100 to 200 µm.

In the ground layers 7, the first ground layers 18 serve as lower ground layers 51 with respect to the signal wirings 4 of the conductive layer 3, the second ground layers 19 (the first lower portions 25 and the first upper portions 26) and the second lower portions 27 of the third ground layers 20 serve as side ground layers 52 with respect to the signal wirings 4 of the conductive layer 3, and the second upper portions 28 of the third ground layers 20 serve as upper ground layers 53 with respect to the signal wirings 4 of the conductive layer 3.

The ground layers 7 are formed such that the signal wirings 4 are interposed between the lower ground layers 51 and the upper ground layers 53 in the thickness direction and interposed between the individual side ground layers 52 in the widthwise direction. As a result, the ground layers 7 surround the respective signal wirings 4 in the widthwise direction and in the thickness direction.

As shown in FIG. 1, in the wired circuit board 1, a plurality of slits 8 are formed between the signal wirings 4 in the insulating layer 2.

More specifically, the slits 8 are formed between the individual ground layers 7 arranged adjacent to each other in the widthwise direction to correspond to the respective signal wirings 4, as shown in FIG. 2. Each of the slits 8 is formed to penetrate the insulating layers 2 (the first insulating layer 9, the second insulating layer 10, the third insulating layer 11, and the fourth insulating layer 12) in the thickness direction.

As shown in FIG. 1, the respective slits 8 are extensively formed adjacent to the respective display-side connecting terminals 13, and adjacent to the respective operation-side connecting terminals 14 when viewed in plan view. More specifically, each of the slits 8 is formed to extend between the one longitudinal end of each of the third insulating layer 11 and the fourth insulating layer 12 and the other longitudinal end of each of the third insulating layer 11 and the fourth insulating layer 12. The slits 8 have round holes 22 formed at the both longitudinal ends thereof to outwardly protrude in the widthwise direction.

The size of each of the slits 8 is appropriately selected depending on the size of the wired circuit board 1 and the number of the signal wirings 4. The width of each of the slits 8 halfway in the longitudinal direction is in the range of, e.g., 25 to 75 µm, or preferably 30 to 50 µm. The spacing between the individual slits 8 is in the range of, e.g., 0.23 to 0.8 mm, or preferably 0.28 to 0.5 mm. The diameter of each of the round holes 22 is in the range of, e.g., 25 to 75 µm, or preferably 30 to 75 µm. For example, the spacing between the one longitudinal end edge of each of the round holes 22 and the one longitudinal end edge of each of the third insulating layer 11 and the fourth insulating layer 12 at the one longitudinal end is the same as the spacing between the other longitudinal end edge of each of the round holes 22 and the other longitudinal end edge of each of the third insulating layer 11 and the fourth insulating layer 12 at the other longitudinal end, which is in the range of, e.g., not more than 5.0 mm, or preferably 0.3 to 1.0 mm.

Figure 3:
FIG. 3 is a production process view showing a method for producing the wired circuit board shown in FIG. 2,
 (a) showing the step of preparing a metal supporting board,
 (b) showing the step of forming a first insulating layer on the metal supporting board,
 (c) showing the step of forming first ground layers on the first insulating layer,
 (d) showing the step of forming a second insulating layer on the first insulating layer to cover the first ground layers,
 (e) showing the step of forming a conductive layer and second ground layers on the second insulating layer, and
 (f) showing the step of forming a third insulating layer on the second insulating layer to cover the conductive layer and the second ground layers.
Figure 3:
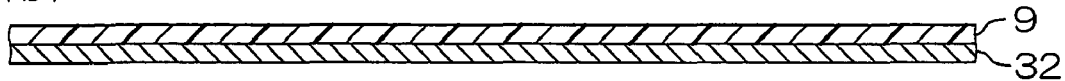
Figure 3:
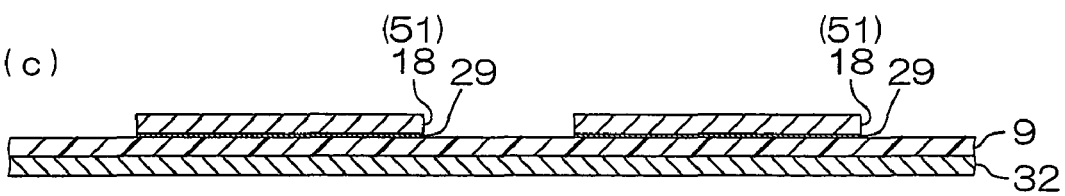
Figure 3:
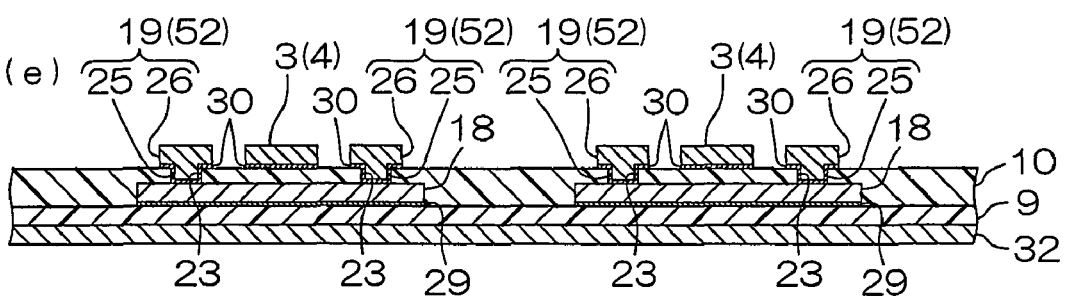
Figure 3:
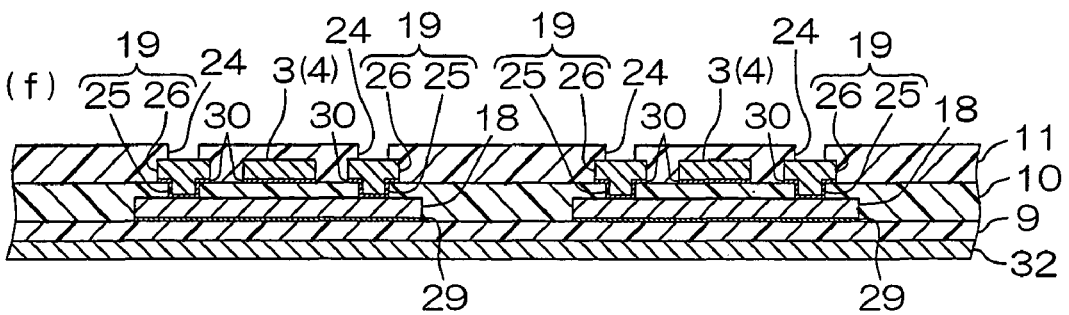
Figure 4:
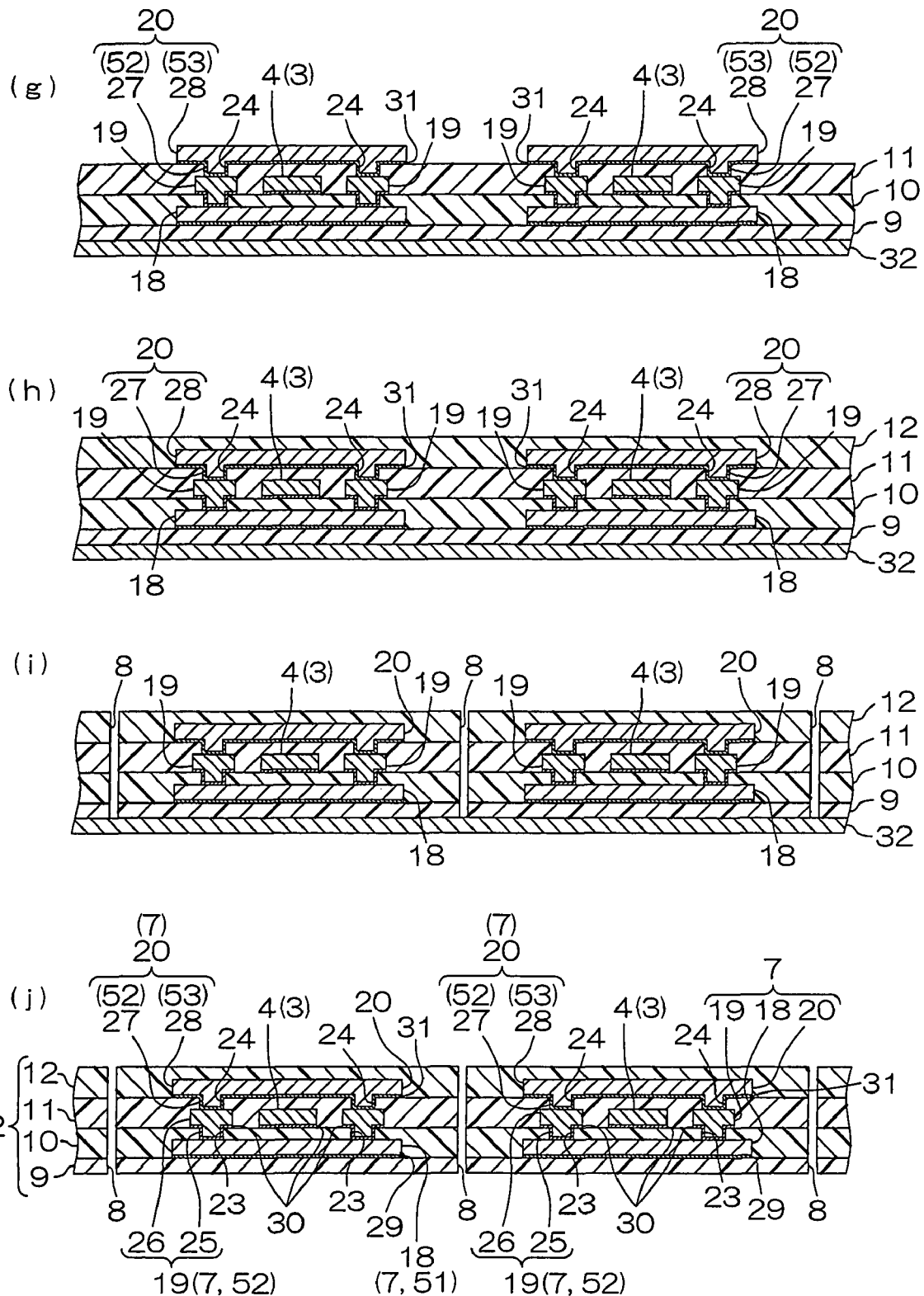
FIG. 4 is a production process view showing the method for producing the wired circuit board shown in FIG. 2, subsequently to FIG. 3,
 (g) showing the step of forming third ground layers on the second ground layers and the third insulating layer,
 (h) showing the step of forming a fourth insulating layer on the third insulating layer to cover the third ground layers,
 (i) showing the step of forming a plurality of slits between the signal wirings in the insulating layers, and
 (j) showing the step of removing the metal supporting board.

Next, a description is given to a method for producing the wired circuit board 1 with reference to FIGS. 3 and 4.

First, as shown in FIG. 3(a), a metal supporting board 32 is prepared in the method.

As shown in FIGS. 3(b) to 4(i), the metal supporting board 32 is a board for supporting the insulating layers 2, the conductive layer 3, and the ground layers 7, and is formed in a generally rectangular shape extending in the longitudinal direction when viewed in plan view. Examples of a metal material used to form the metal supporting board 32 include stainless steel, 42-alloy, aluminum, copper, copper-beryllium alloy, or phosphor bronze. Preferably, stainless steel is used to form the metal supporting board 32. The thickness of the metal supporting board 32 is in the range of, e.g., 10 to 50 µm, or preferably 18 to 25 µm.

Then, as shown in FIG. 3(b), the first insulating layer 9 is formed on the metal supporting board 32.

The first insulating layer 9 is formed in the foregoing pattern by, e.g., coating a varnish of a photosensitive synthetic resin on the upper surface of the metal supporting board 32, drying it, exposing it to light via a photomask, developing it, and curing it as necessary.

Then, as shown in FIG. 3(c), the first ground layers 18 are formed on the first insulating layer 9.

The first ground layers 18 are formed in the foregoing pattern on the upper surface of the first insulating layer 9 by, e.g., an additive method.

In the additive method, the first metal thin film 29 is formed first on the upper surface of the first insulating layer 3. Preferably, the first metal thin film 29 is formed by laminating a chromium thin film and a copper thin film by chromium sputtering and copper sputtering.

Then, a plating resist, not shown, is formed in a pattern reverse to the foregoing pattern on the upper surface of the first metal thin film 29. Subsequently, the first ground layers 18 are formed by electrolytic plating in the foregoing pattern on the upper surface of the first metal thin film 29 exposed from the plating resist. Thereafter, the plating resist and the portion of the first metal thin film 29 where the plating resist is laminated are removed.

Then, as shown in FIG. 3(*d*), the second insulating layer 10 is formed on the first insulating layer 9 to cover the first ground layers 18.

The second insulating layer 10 is formed in a pattern in which the foregoing first openings 23 are formed by, e.g., coating a varnish of a photosensitive synthetic resin on the upper surface of the first insulating layer 9 including the first ground layers 18, drying it, exposing it to light via a photomask, developing it, and curing it as necessary.

Then, as shown in FIG. 3(*e*), the conductive layer 3 is formed on the second insulating layer 10, while the second ground layers 19 are formed on the first ground layers 18 and the second insulating layer 10.

The conductive layer 3 and the second ground layers 19 are formed in the foregoing pattern by the same additive method as used to form the first ground layers 18 described above.

In the additive method, the second metal thin film 30 is formed first on the upper surfaces of the first ground layers 18 exposed from the first openings 23 of the second insulating layer 10 and on the upper surface of the second insulating layer 10 (and on the inner side surfaces of the first openings 23). The second metal thin film 30 is formed by sputtering, or preferably by laminating a chromium thin film and a copper thin film by chromium sputtering and copper sputtering.

Then, a plating resist, not shown, is formed in a pattern reverse to the wired circuit pattern of the conductive layer 3 and to the pattern of the second ground layers 19 on the upper surface of the second metal thin film 30. Subsequently, the conductive layer 3 and the second ground layers 19 are formed by electrolytic plating on the upper surface of the second metal thin film 30 exposed from the plating resist (and on the side surfaces of the second metal thin film 30 formed on the inner side surfaces of the first openings 23). Thereafter, the plating resist and the portion of the second metal thin film 30 where the plating resist is laminated are removed.

In this manner, the conductive layer 3 and the second ground layers 19 can be formed simultaneously.

Then, as shown in FIG. 3(*f*), the third insulating layer 11 is formed on the second insulating layer 10 to cover the conductive layer 3 and the second ground layers 19.

The third insulating layer 11 is formed in a pattern in which the foregoing second openings 24 are formed by coating a varnish of a photosensitive synthetic resin on the upper surface of the second insulating layer 10 including the conductive layer 3 and the second ground layers 19, drying it, exposing it to light via a photomask, developing it, and curing it as necessary.

Then, as shown in FIG. 4(*g*), the third ground layers 20 are formed on the second ground layers 19 and the third insulating layer 11.

The third ground layers 20 are formed in the foregoing pattern by the same additive method as used to form the first ground layers 18 described above.

In the additive method, the third metal thin film 31 is formed first on the upper surfaces of the second ground layers 19 exposed from the second openings 24 of the third insulating layer 11 and on the upper surface of the third insulating layer 11 (and on the inner side surfaces of the second openings 24). The third metal thin film 31 is formed by sputtering, or preferably by laminating a chromium thin film and a copper thin film by chromium sputtering and copper sputtering.

Then, a plating resist, not shown, is formed in a pattern reverse to the pattern of the third ground layers 20 on the upper surface of the third metal thin film 31. Subsequently, the third ground layers 20 are formed by electrolytic plating on the upper surface of the third metal thin film 31 exposed from the plating resist (and on the side surfaces of the third metal thin film 31 formed on the inner side surfaces of the second openings 24). Thereafter, the plating resist and the portion of the third metal thin film 31 where the plating resist is laminated are removed.

Then, as shown in FIG. 4(*h*), the fourth insulating layer 12 is formed on the third insulating layer 11 to cover the third ground layers 20.

The fourth insulating layer 12 is formed in the foregoing pattern by, e.g., coating a varnish of a photosensitive synthetic resin on the upper surface of the third insulating layer 11 including the third ground layers 20, drying it, exposing it to light via a photomask, developing it, and curing it as necessary.

Then, as shown in FIG. 4(*i*), the plurality of slits 8 are formed between the signal wirings 4 in the insulating layers 2 along the longitudinal direction.

The slits 8 are opened by, e.g., dry etching using a plasma or a laser, wet etching such as chemical etching, or the like to penetrate the fourth insulating layer 12, the third insulating layer 11, the second insulating layer 10, and the first insulating layer 9 in the thickness direction.

As a result, the slits 8 are extensively formed adjacent to the respective display-side connecting terminals 13 and to the respective operation-side connecting terminals 14 to have the round holes 22 formed at the both longitudinal ends thereof.

Then, as shown in FIG. 4(*j*), the metal supporting board 32 is removed.

The metal supporting board 32 is removed by, e.g., wet etching using an etching solution such as an aqueous alkaline solution (ferric chloride aqueous solution or the like).

In this manner, the wired circuit board 1 can be obtained.

The thickness of the wired circuit board 1 produced by the method shown above is in the range of, e.g., 150 to 350 μm, or preferably 180 to 250 μm.

Figure 5:
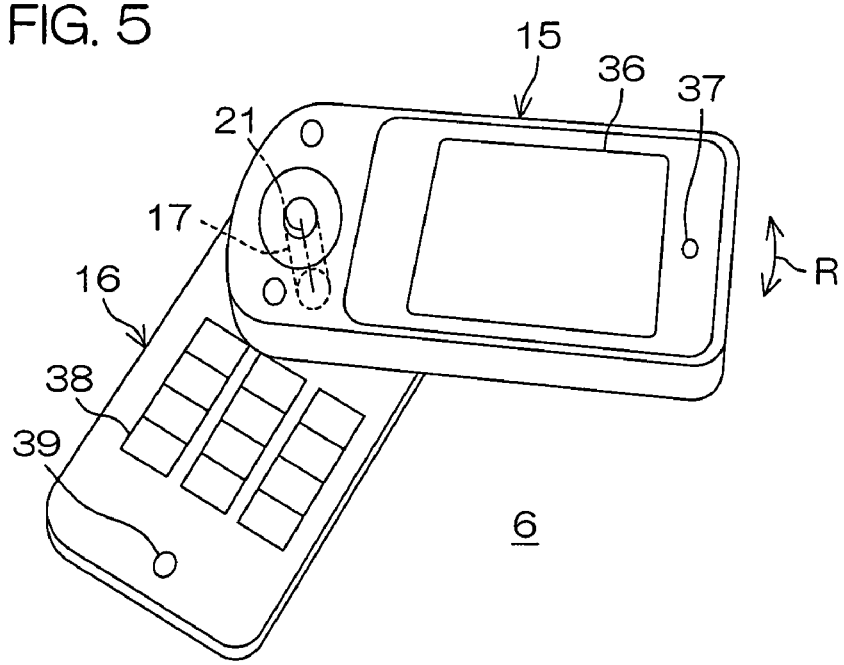
FIG. 5 is a perspective view of a cellular phone as an embodiment of an electronic device according to the present invention in which the wired circuit board according to the present invention is mounted.
Figure 6:
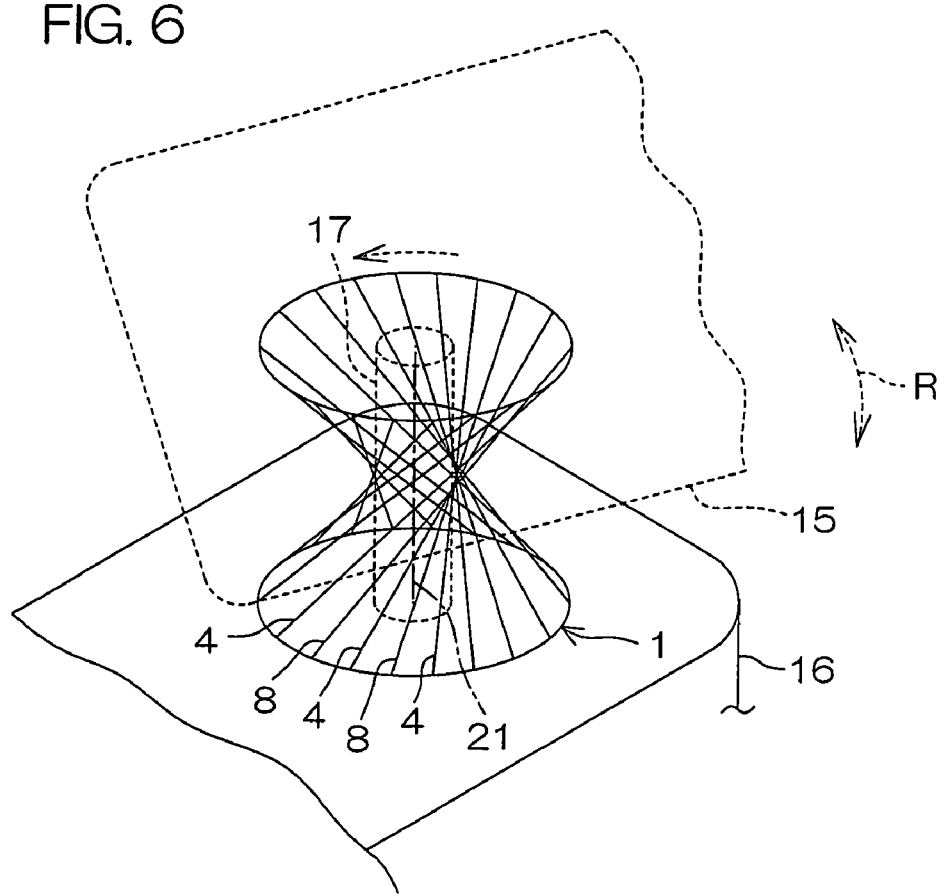
FIG. 6 is an enlarged perspective view of the wired circuit board at the connecting member of the cellular phone shown in FIG. 5.
Figure 7:
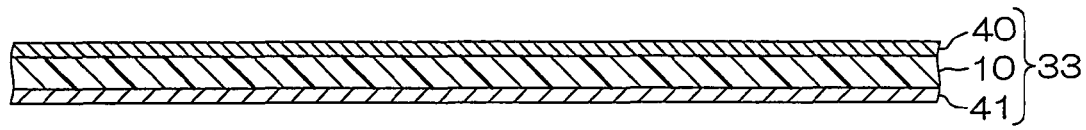
FIG. 7 is a production process view showing a method for producing a wired circuit board according to another embodiment of the present invention,
 (a) showing the step of preparing a metal-clad laminated base material in which a first metal layer and a second metal layer are laminated on both sides of a second insulating layer,
 (b) showing the step of forming a conductive layer on the second insulating layer and forming lower ground layers under the second insulating layer,
 (c) showing the step of forming a third insulating layer on the second insulating layer to cover the conductive layer, and
 (d) showing the step of forming third openings in the second insulating layer and the third insulating layer.
Figure 7:
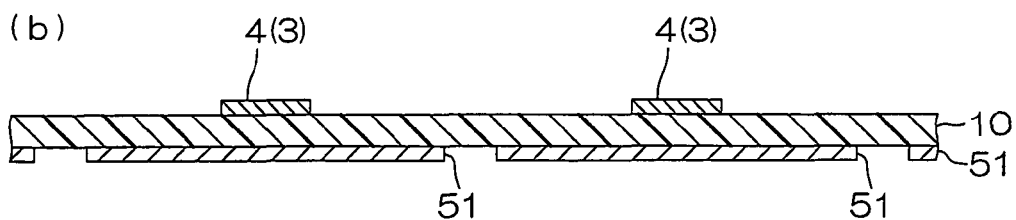
Figure 7:
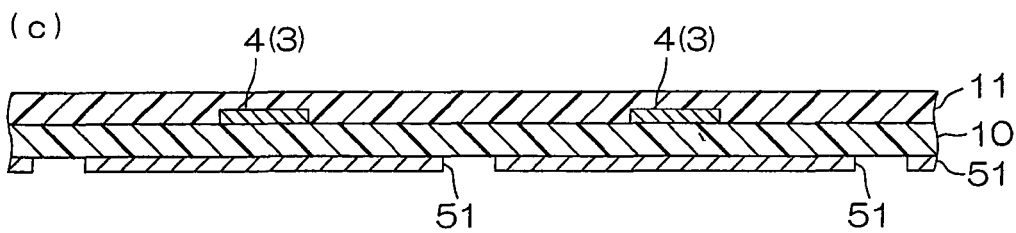
Figure 7:
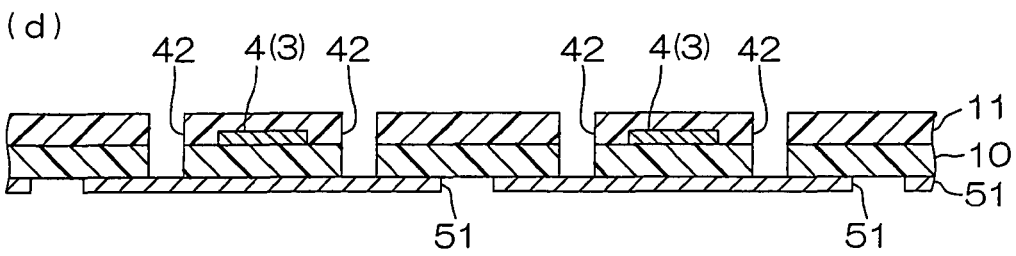
Figure 8:
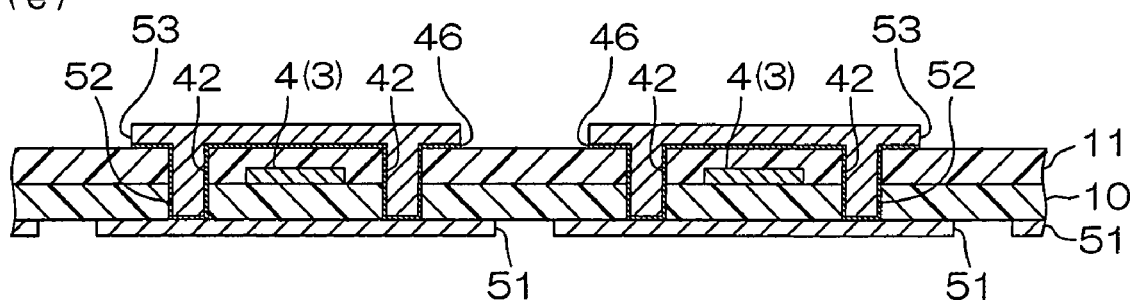
FIG. 8 is a production process view showing the method for producing the wired circuit board according to the other embodiment of the present invention, subsequently to FIG. 7,
 (e) showing the step of forming side ground layers and upper ground layers on the lower ground layers and the third insulating layer,
 (f) showing the step of forming a fourth insulating layer on the third insulating layer and forming a first insulating layer under the second insulating layer, and
 (g) showing the step of forming a plurality of slits between the signal wirings in the insulating layers.
Figure 8:
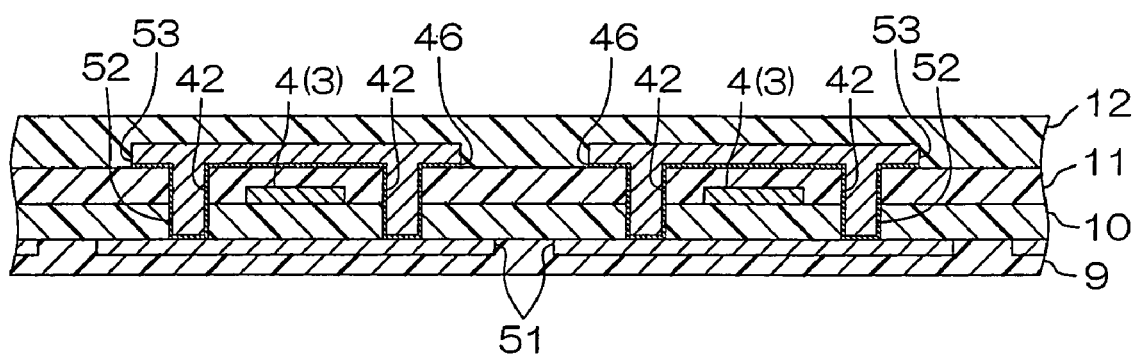
Figure 8:
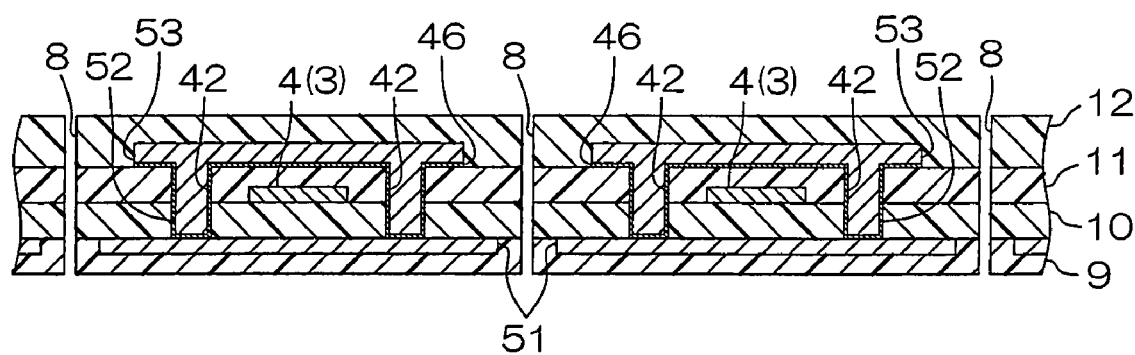
Figure 9:
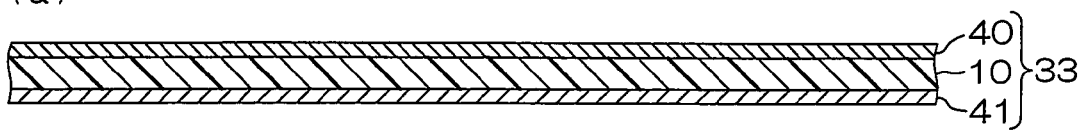
FIG. 9 is a production process view showing a method for producing a wired circuit board according to still another embodiment of the present invention,
 (a) showing the step of preparing a metal-clad laminated base material in which a first metal layer and a second metal layer are laminated on both sides of a second insulating layer,
 (b) showing the step of forming a second conductive layer on the upper surface of the first metal layer and forming fifth ground layers on the lower surface of the second metal layer,
 (c) showing the step of forming a conductive layer composed of a first conductive layer and the second conductive layer and forming lower ground layers composed of fourth ground layers and the fifth ground layers,
 (d) showing the step of forming a third insulating layer on the second insulating layer to cover the conductive layer, and
 (e) showing the step of forming third openings in the second insulating layer and the third insulating layer.
Figure 9:
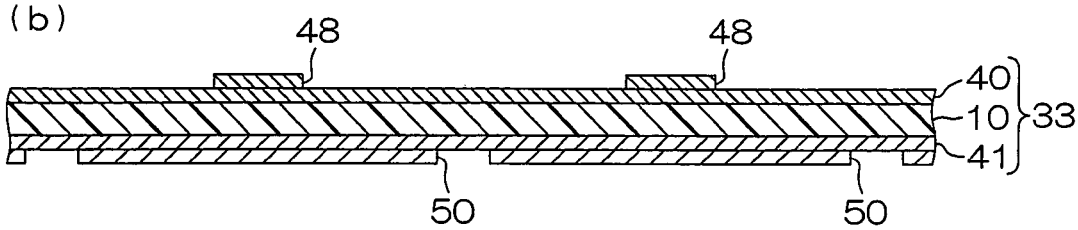
Figure 9:
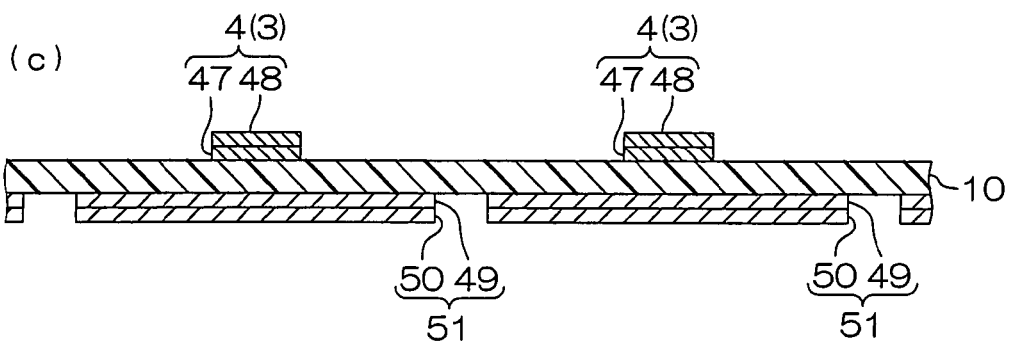
Figure 9:
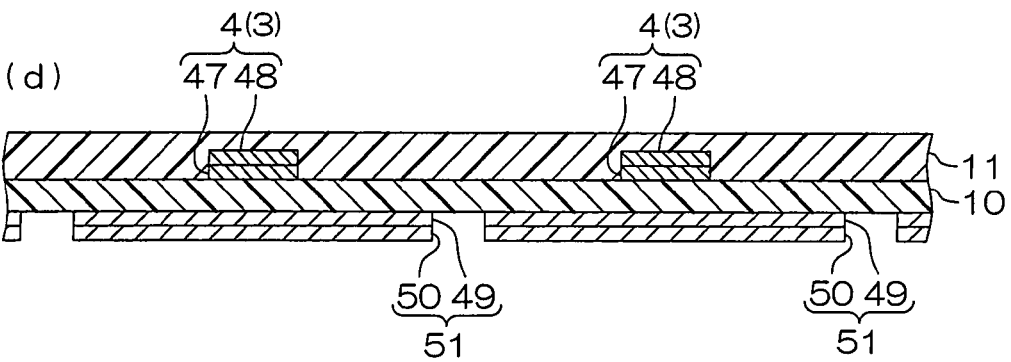
Figure 9:
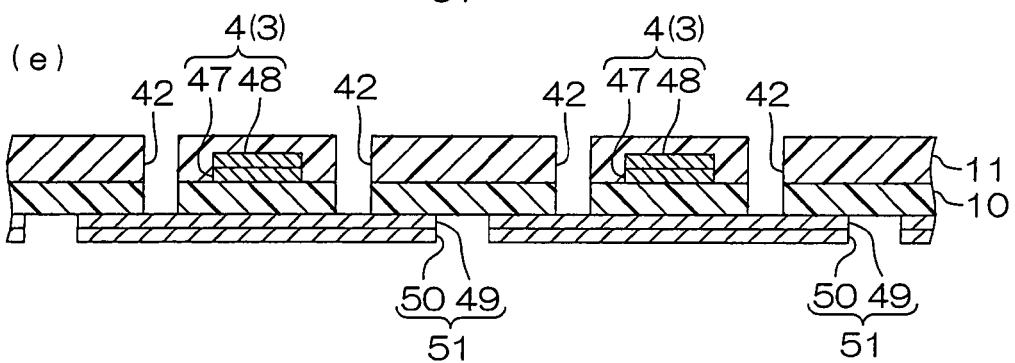
Figure 10:
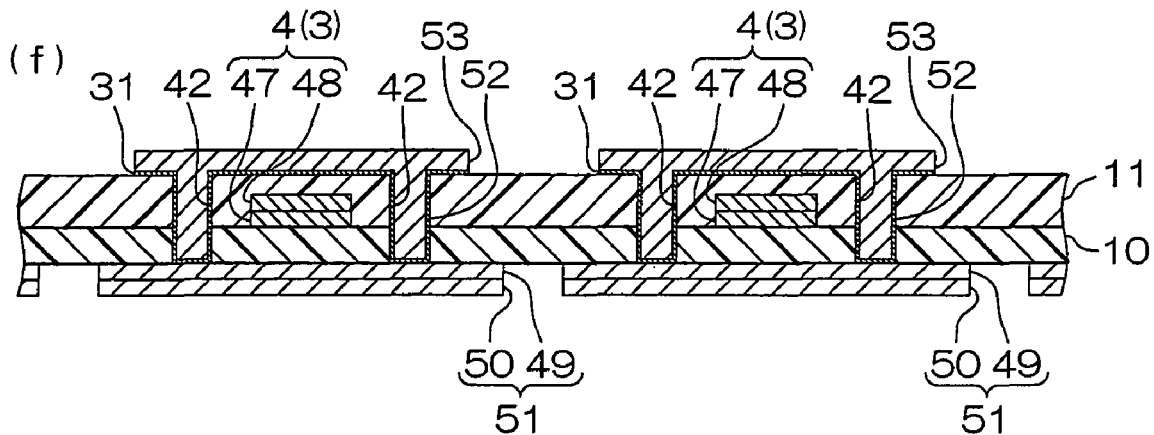
FIG. 10 is a production process view showing the method for producing the wired circuit board according to the still other embodiment of the present invention, subsequently to FIG. 9,
 (f) showing the step of forming side ground layers and upper ground layers on the lower ground layers and the third insulating layer,
 (g) showing the step of forming a fourth insulating layer on the third insulating layer and forming a first insulating layer under the second insulating layer, and
 (h) showing the step of forming a plurality of slits between the signal wirings in the insulating layers.
Figure 10:
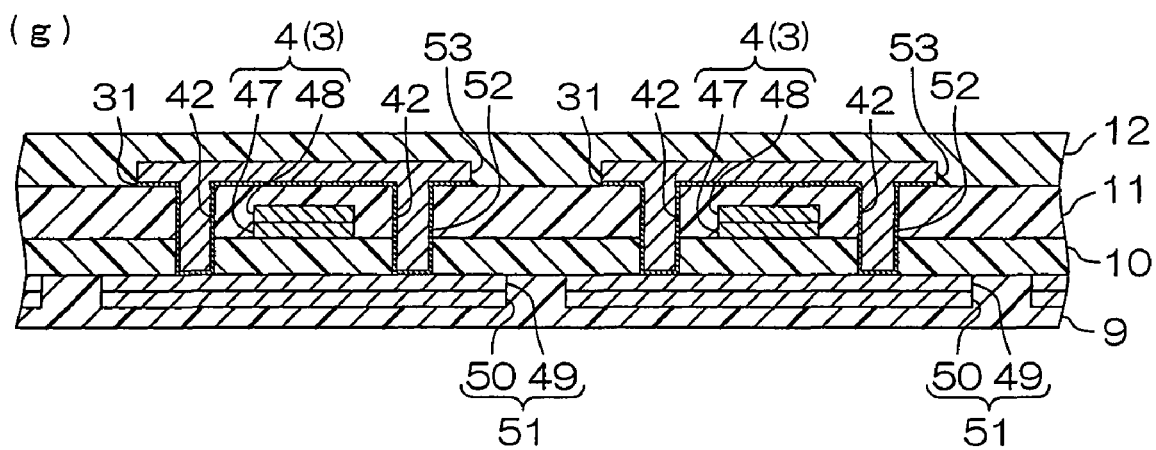
Figure 10:
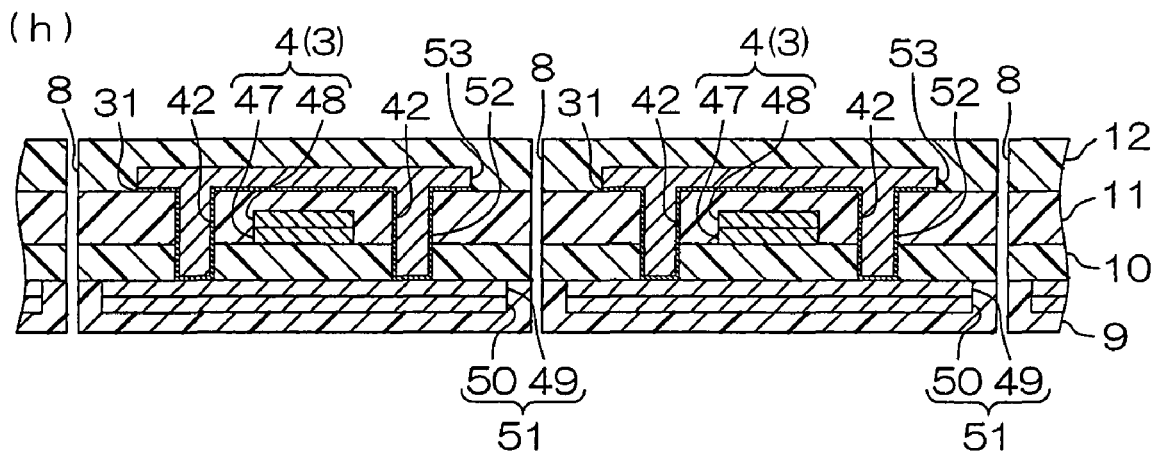

FIG. 5 is a perspective view of a cellular phone as an embodiment of an electronic device according to the present invention in which the wired circuit board according to the present invention is mounted. FIG. 6 is an enlarged perspective view of the wired circuit board at the connecting member of the cellular phone shown in FIG. 5.

Next, with reference to FIGS. 5 and 6, a description will be given to the cellular phone 6 in which the wired circuit board 1 produced in the manner described above is mounted.

In FIG. 5, the cellular phone 6 includes the display-side casing 15 as a first casing, the operation-side casing 16 as a second casing connected to the display-side casing 15, a connecting member 17 for connecting the display-side casing 15 and the operation-side casing 16 be relatively movable therebetween, and the wired circuit board 1 (see FIG. 6).

The display-side casing 15 includes a liquid-crystal display portion 36 and a speech receiving portion 37 on the upper surface thereof and also incorporates a display-side electronic component as an electronic component, which is not shown.

The operation-side casing 16 is disposed parallel with the display-side casing 15 and formed in the same shape as the display-side casing 15 to be superimposed thereon. The operation-side casing 16 includes a key operation portion 38 and a speech sending portion 39 on the upper surface thereof and also incorporates an operation-side electronic component as an electronic component, which is not shown.

The connecting member 17 includes a rotation shaft 21 inserted into the end of the display-side casing 15 and into the end of the operation-side casing 16. The rotation shaft 21 is rotatably fixed to the display-side casing 15 and to the operation-side casing 16. This allows the display-side casing 15 and the operation-side casing 16 to be circumferentially rotatable around the rotation shaft 21 as the center of rotation.

As shown in FIGS. 1 and 6, the wired circuit board 1 is provided such that the respective signal wirings 4 and the respective slits 8 are arranged parallel around the connecting member 17, and along the direction of rotation R (the direction in which the display-side casing 15 and the operation-side casing 16 relatively rotate) of the rotation shaft 21 of the connecting member 17. The wired circuit board 1 has one longitudinal end disposed on the display-side casing 15 to connect the display-side connecting terminals 13 thereof to the connectors, not shown, of the display-side electronic components of the display-side casing 15. The wired circuit board 1 also has the other longitudinal end disposed on the operation-side casing 16 to connect the operation-side connecting terminals 14 thereof to the connectors, not shown, of the operation-side electronic components of the operation-side casing 16.

In the cellular phone 6, when the display-side casing 15 and the operation-side casing 16 are relatively rotated around the rotation shaft 21 as the center of rotation, the wired circuit board 1 is twisted along the direction in which the display-side casing 15 and the operation-side casing 16 relatively rotate, i.e., the direction in which the signal wirings 4 are arranged parallel, or more specifically the widthwise direction of the wired circuit board 1 to receive a stress that distorts the wired circuit board 1 in the widthwise direction, as shown in FIG. 6. However, in the wired circuit board 1, the slits 8 are formed between the signal wirings 4 in the insulating layer 2 to be capable of relieving such a stress. As a result, it is possible to relatively rotate the display-side casing 15 and the operation-side casing 16 smoothly by the connecting member 17 and prevent damage such as the breakage of the signal wiring 4 of the wired circuit board 1 at the connecting member 17 to ensure excellent long-term reliability.

In addition, the wired circuit board 1 provided in the cellular phone 6 includes the ground layers 7 formed to surround each of the signal wirings 4 in the widthwise direction and thickness direction of the wired circuit board 1. Consequently, even when a signal transmitted by each of the signal wirings 4 is increased in frequency, a transmission loss in the signal wiring 4 can be reduced.

When the wiring circuit board 1 is used to connect the respective connector of the display-side electronic component of the display-side casing 15 and the operation-side electronic component of the operation-side casing 16, characteristic impedance matching between the wired circuit board 1 and the display-side electronic component and operation-side electronic component of the cellular phone 6 can be achieved more reliably than in the case where connection is provided using the signal wirings and a plurality of coaxial cables including ground wirings which concentrically surround the signal wirings. As a result, a transmission loss due to characteristic impedance mismatching at these connecting points can be reliably reduced.

Moreover, the round holes 22 are formed at the both longitudinal ends of the slits 8 of the wired circuit board 1. This allows the prevention of a tear resulting from corners formed at the both longitudinal ends of each of the slits 8. As a result, it is possible to effectively prevent breakage such as the tearing of the wired circuit board 1 at the both longitudinal ends of the slit 8 toward the both longitudinal end edges of the wired circuit board 1.

In the description given above, the display-side casing 15 and the operation-side casing 16 are connected by the connecting member 17 to be relatively rotatable in the direction in which the display-side casing 15 and the operation-side casing 16 are parallel with each other. However, the display-side casing 15 and the operation-side casing 16 can also be connected to be relatively rotatable in a perpendicular direction to the direction in which the display-side casing 15 and the operation-side casing 16 are parallel, i.e., connected to be foldable (openable and closable). When the display-side casing 15 and the operation-side casing 16 are connected to be foldable, the rotation shaft 21 of the connecting member 17 is disposed along the end edges of the cellular phone 6 and the respective signal wirings 4 and respective slits 8 of the wired circuit board 1 are arranged parallel along the circumferential direction of the rotation shaft 21, which is not shown.

Although the cellular phone 6 is shown as an example of the electronic device in the description given above, the present invention is not limited thereto. It is also possible to show various electronic devices each having a connecting member, such as a notebook personal computer and a video camera, as examples.

Figure 11:
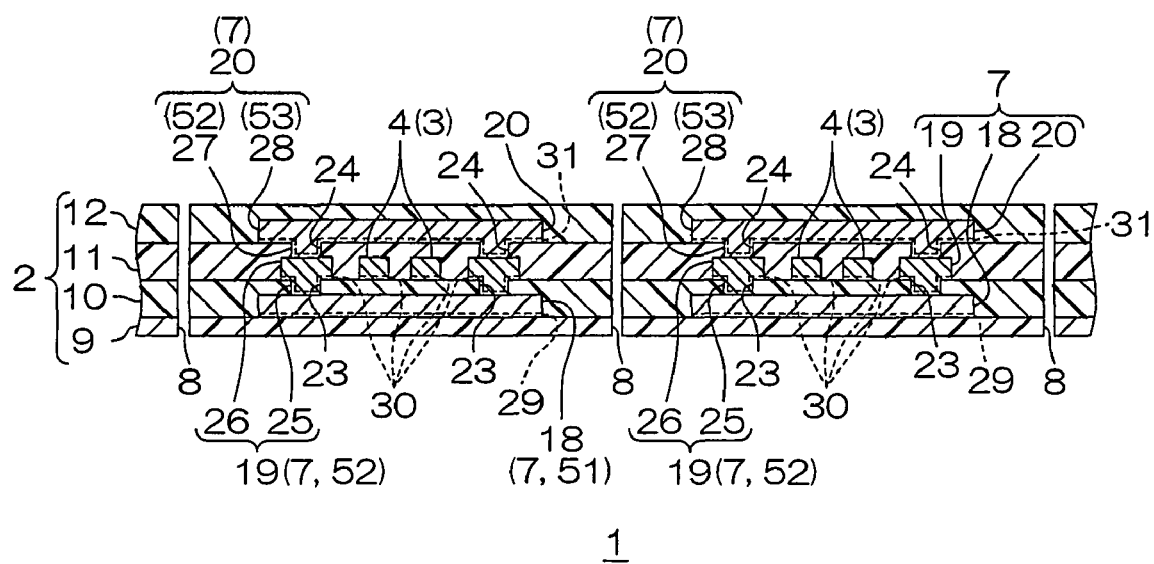
FIG. 11 is a partial cross-sectional view of the wired circuit board according to yet another embodiment of the present invention, which corresponds to FIG. 2.

In the description given above, each of the signal wirings 4 is provided to be surrounded by the single ground layer 7. However, the number of the signal wirings 4 is not limited, and two or more signal wirings 4 can also be provided to be surrounded by the single ground layer 7. For example, the two signal wirings 4 can also be provided in widthwise spaced-apart relation to be surrounded by the single ground layer 7, as shown in FIG. 11.

In the description given above, the slits 8 are extensively formed adjacent to the respective display-side connecting terminals 13, and adjacent to the respective operation-side connecting terminals 14. However, the slits 8 may be placed appropriately at any positions as long as they are between the signal wirings 4. For example, it is also possible to, e.g., form the slits 8 only in the generally middle portion in the longitudinal direction of the wired circuit board 1, though not shown.

Preferably, the slits 8 are extensively formed adjacent to the respective display-side connecting terminals 13, and adjacent to the respective operation-side connecting terminals 14, as shown in FIG. 1. By thus forming the slits 8, it is possible to more reliably relieve the stress mentioned above, while the strength of the entire wired circuit board 1 is secured and each of the slits 8 is provided with a sufficient length.

Next, a description will be given to the other embodiments of the wired circuit board according to the present invention with reference to FIGS. 7 to 11. In FIGS. 7 to 11, the members corresponding to the individual members described above are designated by the same reference numerals as used above and the detailed description thereof is omitted.

In the description given above, the metal supporting board 32 is used in the production of the wired circuit board 1. However, the present invention is not limited thereto. For example, it is also possible to produce the wired circuit board 1 from, e.g., a metal-clad laminated base material 33.

First, as shown in FIG. 7(a), the metal-clad laminated base material (such as copper-clad laminated base material) 33 is prepared in which, e.g., a first metal layer 40 is preliminarily laminated on the upper surface of the second insulating layer 10 and a second metal layer 41 is preliminarily laminated on the lower surface of the second insulating layer 10.

Then, as shown in FIG. 7(b), a dry film resist, not shown, is laminated on the first metal layer 40 by, e.g., a subtractive method, exposed to light, and developed to form an etching resist, not shown, in the same pattern as the wired circuit pattern of the conductive layer 3. At the same time, a dry film resist, not shown, is laminated under the second metal layer 41, exposed to light, and developed to form an etching resist, not shown, in the same pattern as the pattern of the lower ground layers 51. Subsequently, wet etching is performed with respect to the first metal layer 40 and the second metal layer 41 exposed from the etching resists, and then the etching resists are removed. As a result, the conductive layer 3 is formed on the second insulating layer 10 and the lower ground layers 51 are formed under the second insulating layer 10.

Then, as shown in FIG. 7(c), the third insulating layer 11 is formed on the second insulating layer 10 to cover the conductive layer 3.

Then, as shown in FIG. 7(d), third openings 42 are formed in the second insulating layer 10 and the third insulating layer 11 to penetrate in the thickness direction.

The third openings 42 are formed at the same positions as the foregoing first openings 23 of the second insulating layer 10 and the foregoing second openings 24 of the third insulating layer 11 when viewed in plan view to have the same widths as the first openings 23 and the second openings 24 in the thickness direction.

The third openings 42 are formed by dry etching using, e.g., a plasma or a laser or the like.

Then, as shown in FIG. 8(e), the side ground layers 52 and the upper ground layers 53 are formed on the lower ground layers 51 and the third insulating layer 11.

The side ground layers 52 are filled in the third openings 42 in the second insulating layer 10 and the third insulating layer 11 and formed in integral and continuous relation to the upper ground layers 53.

When the side ground layers 52 and the upper ground layers 53 are formed by an additive method described next, a fourth metal thin film 46 is interposed between the side ground layers 52 or the upper ground layers 53 and each of the respective upper surfaces of the lower ground layers 51 exposed from the third openings 42 of the second insulating layer 10 and the third insulating layer 11, the respective inner side surfaces of the third openings 42 of the second insulating layer 10 and the third insulating layer 11, and the upper surface of the third insulating layer 11 covered with the upper ground layers 53.

The side ground layers 52 and the upper ground layers 53 are formed in the foregoing pattern on the lower ground layers 51 and the third insulating layer 11 by, e.g., the additive method or a printing method using a conductive paste.

In the additive method, the fourth metal thin film 46 is formed first on the upper surfaces of the lower ground layers 51 exposed from the third openings 42 of the second insulating layer 10 and the third insulating layer 11, on the upper surface of the third insulating layer 11, and on the inner side surfaces of the third openings 42 of the second insulating layer 10 and the third insulating layer 11. The fourth metal thin film 46 is formed by the same method as used to form the second metal thin film 30 and the third metal thin film 31.

Then, a plating resist, not shown, is formed in a pattern reverse to the pattern of the upper ground layers 53 on the upper surface of the fourth metal thin film 46. Subsequently, the side ground layers 52 and the upper ground layers 53 are formed by electrolytic plating on the upper surface of the fourth metal thin film 46 exposed from the plating resist (and on the inner side surfaces of the third openings 42). Thereafter, the plating resist and the portion of the fourth metal thin film 46 where the plating resist is laminated are removed.

In the printing method using a conductive paste, the side ground layers 52 and the upper ground layers 53 are formed in the foregoing pattern by, e.g., screen-printing the conductive paste to the upper surface of the third insulating layer 11 including the third openings 42 and the lower ground layers 51 exposed from the third openings 42 and sintering the conductive paste. As examples of the conductive paste, a conductive paste containing fine particles of any of the metal materials mentioned above, preferably a copper paste containing fine copper particles, or the like can be listed. In the printing method using the conductive paste, the side ground layers 52 and the upper ground layers 53 can be formed in the foregoing pattern at low cost.

Of these methods, the additive method is preferably used to form the side ground layers 52 and the upper ground layers 53 in the foregoing pattern.

The side ground layers 52 are formed to have equal widths in the entire thickness direction. The widths of the side ground layers 52 are the same as the widths of the first lower portions 25 of the second ground layers 19 and the widths of the second lower portions 27 of the third ground layers 20, each mentioned above.

Then, as shown in FIG. 8(f), the fourth insulating layer 12 is formed on the third insulating layer 11 to cover the upper ground layers 53, while the first insulating layer 9 is formed under the second insulating layer 10 to cover the lower ground layers 51.

The fourth insulating layer 12 and the first insulating layer 9 are formed in the foregoing pattern by, e.g., coating a varnish of a photosensitive synthetic resin on the upper surface of the third insulating layer 11 including the upper ground layers 53 and on the lower surface of the second insulating layer 10 including the lower ground layers 51, drying it, exposing it to light via a photomask, developing it, and curing it as necessary.

The formation of the fourth insulating layer 12 and the first insulating layer 9 is not limited to the method shown above. For example, it is also possible to preliminarily form a synthetic resin into a film in the foregoing pattern and sticking the film to each of the upper surface of the third insulating layer 11 including the upper ground layers 53 and the lower surface of the second insulating layer 10 including the lower ground layers 51 via a known adhesive layer.

Then, as shown in FIG. 8(g), the plurality of slits 8 are formed between the signal wirings 4 in the insulating layers 2 to extend along the longitudinal direction.

The slits 8 are formed by opening the fourth insulating layer 12, the third insulating layer 11, the second insulating layer 10, and the first insulating layer 9 in the thickness direction in accordance with the same method as shown above.

In this manner, the wired circuit board 1 can be obtained.

The thickness of the wired circuit board 1 produced by the method shown above is in the range of, e.g., 150 to 350 µm, or preferably 180 to 250 µm.

In accordance with the method, the wired circuit board 1 can be formed from the metal-clad laminated base material 33 without using the metal supporting board 32. As a result, it is unnecessary to remove the metal supporting board 32 and the wired circuit board 1 can be produced easily.

Moreover, in accordance with the method, the side ground layers 52 and the upper ground layers 53 need not be formed in two steps, but can be formed in one step, as described above. As a result, the wired circuit board 1 can be produced more easily.

In the wired circuit board 1 produced in accordance with the method, the side ground layers 52 can be formed to have equal widths in the entire thickness direction. As a result, unlike in the side ground layers 52 described above, the first upper portions 26 of the second ground layers 19 outwardly protruding in the widthwise direction from each of the first lower portions 25 and the second lower portions 27 are not formed in the side ground layers 52. Accordingly, even when the side ground layers 52 and the signal wirings 4 are brought closer to each other by the widthwise lengths of such protruding portions, sufficient intervals are ensured between the side ground layers 52 and the signal wirings 4.

In the description given above, each of the conductive layer 3 and the lower ground layers 51 is formed of a single layer. However, the present invention is not limited thereto. For example, it is also possible to form the conductive layer 3 of two conductive layers and form each of the lower ground layers 51 of two lower ground layers.

First, as shown in FIG. 9(a), the metal-clad laminated base material 33, e.g., is prepared in the method.

Then, as shown in FIG. 9(b), a dry film resist, not shown, e.g., is laminated on the upper surface of the first metal layer 40, exposed to light, and developed to form a plating resist, not shown, in a pattern reverse to the wired circuit pattern of the conductive layer 3. At the same time, a dry film resist, not shown, is laminated on the lower surface of the second metal layer 41, exposed to light, and developed to form a plating resist, not shown, in a pattern reverse to the pattern of the lower ground layers 51. Subsequently, in accordance with the additive method, a second conductive layer 48 is formed by electrolytic plating in the foregoing wired circuit pattern on the upper surface of the first metal layer 40 exposed from the upper plating resist, while fifth ground layers 50 are formed by electrolytic plating in the foregoing pattern on the lower surface of the second metal layer 41 exposed from the lower plating resist.

Then, as shown in FIG. 9(c), in accordance with, e.g., the subtractive method, the upper plating resist and the portion of the first metal layer 40 where the plating resist is laminated are removed by etching, while the lower plating resist and the portion of the second metal layer 41 where the plating resist is laminated are removed by etching. As a result, the double-layered conductive layer 3 composed of a first conductive layer 47 and the second conductive layer 48, and the double-layered lower ground layers 51 each composed of a fourth ground layer 49 and the fifth ground layer 50 are formed.

The thickness of the second conductive layer 48 is in the range of, e.g., 3 to 18 µm, or preferably 8 to 12 µm. The thickness of the conductive layer 3 is in the range of, e.g., 3 to 18 µm, or preferably 8 to 15 µm. The thickness of each of the fifth ground layers 50 is in the range of, e.g., 3 to 18 µm, or preferably 8 to 12 µm. The thickness of each of the lower ground layers 51 is in the range of, e.g., 3 to 18 µm, or preferably 8 to 15 µm.

Then, as shown in FIG. 9(d), the third insulating layer 11 is formed on the second insulating layer 10 to cover the conductive layer 3.

The thickness of the third insulating layer 11 is in the range of, e.g., 5 to 25 µm, or preferably 10 to 20 µm.

Then, as shown in FIG. 9(e), the third openings 42 are formed in the second insulating layer 10 and the third insulating layer 11 to penetrate in the thickness direction.

Then, as shown in FIG. 10(f), the side ground layers 52 and the upper ground layers 53 are formed on the lower ground layers 51 and the third insulating layer 11.

Then, as shown in FIG. 10(g), the fourth insulating layer 12 is formed on the third insulating layer 11 to cover the upper ground layers 53, while the first insulating layer 9 is formed under the second insulating layer 10 to cover the lower ground layers 51.

Then, as shown in FIG. 10(h), the plurality of slits 8 are formed between the signal wirings 4 in the insulating layers 2 along the longitudinal direction.

In this manner, the wired circuit board 1 can be obtained.

The thickness of the wired circuit board 1 produced by the method shown above is in the range of, e.g., 150 to 350 µm, or preferably 180 to 250 µm.

In accordance with the method, by combining the additive method with the subtractive method, the conductive layer 3 can be formed of the two conductive layers, which are the first conductive layer 47 and the second conductive layer 48, and each of the lower ground layers 51 can be formed of the two lower ground layers, which are the fourth ground layer 49 and the fifth ground layer 50.

As a result, the thickness of each of the signal wirings 4 can be easily increased. Therefore, it is possible to more reliably reduce a transmission loss in each of the signal wirings 4 by increasing the thickness of each of the lower ground layers 51 to realize higher-density data.

EXAMPLES

The present invention is described more specifically by showing the example and the comparative example herein below. However, the present invention is by no means limited to the example and the comparative example.

Example 1

A metal supporting board made of stainless steel having a thickness of 20 µm was prepared (see FIG. 3(a)). Then, a varnish of a photosensitive polyamic acid resin was coated on the upper surface of the metal supporting board, dried, exposed to light via a photomask, developed, and cured by heating to form a first insulating layer made of polyimide having a thickness of 12 µm on the metal supporting board (see FIG. 3(b)).

Next, a chromium thin film having a thickness of 0.03 µm and a copper thin film having a thickness of 0.07 µm, each as a first metal thin film, were successively formed on the upper surface of the first insulating layer by chromium sputtering and copper sputtering. Subsequently, a plating resist was formed in a pattern reverse to the pattern of first ground layers on the upper surface of the first metal thin film. Then, in accordance with an additive method, the first ground layers (lower ground layers) each made of copper having a thickness of 12 µm and a width of 300 µm were formed by electrolytic copper plating on the first insulating layer. Thereafter, the plating resist and the portion of the first metal thin film where the plating resist was laminated were removed by chemical etching (see FIG. 3(c)). The spacing between the individual first ground layers was 140 µm.

Next, a varnish of a photosensitive polyamic acid resin was coated on the upper surface of the first insulating layer including the first ground layers, dried, exposed to light via a photomask, developed, and cured by heating to form a second insulating layer having a thickness of 12 µm in a pattern in which first openings were formed on the first insulating layer so as to cover the first ground layers (see FIG. 3(d)).

Next, a chromium thin film having a thickness of 0.03 µm and a copper thin film having a thickness of 0.07 µm, each as a second metal thin film, were successively formed on the upper surfaces of the first ground layers exposed from the first openings of the second insulating layer and on the upper surface of the second insulating layer (and on the inner side surfaces of the first openings) by chromium sputtering and copper sputtering. Subsequently, a plating resist was formed in a pattern reverse to the wired circuit pattern of the conductive layer and to the pattern of second ground layers on the upper surface of the second metal thin film. Then, in accordance with the additive method, a conductive layer made of copper having a thickness of 12 μm and integrally including signal wirings, display-side connecting terminals, and operation-side connecting terminals was formed by electrolytic copper plating on the second insulating layer, while the second ground layers (side ground layers) each integrally including a first upper portion having a thickness of 12 μm and a width of 140 μm, and a first lower portion having a thickness of 12 μm and a width of 40 μm were formed by electrolytic copper plating on the first ground layers and the second insulating layer. Thereafter, the plating resist and the portion of the second metal thin film where the plating resist was laminated were removed by chemical etching (see FIG. 3(e)).

The width of each of the signal wirings was 40 μm. The spacing between the individual signal wirings was 500 μm. The spacing between the first upper portion of each of the second ground layers and the signal wring adjacent thereto was 90 μm.

Next, a varnish of a photosensitive polyamic acid resin was coated on the upper surface of the second insulating layer including the second ground layers and the conductive layer, dried, exposed to light via a photomask, developed, and cured by heating to form a third insulating layer having a thickness of 12 μm in a pattern in which second openings were formed on the second insulating layer so as to cover the conductive layer and the second ground layers (see FIG. 3(f)). The connecting terminals (display-side connecting terminals and operation-side connecting terminals) were exposed from the both longitudinal ends of the third insulating layer. The length of each of the connecting terminals was 10 mm.

Next, a chromium thin film having a thickness of 0.03 μm and a copper thin film having a thickness of 0.07 μm, each as a third metal thin film, were successively formed on the upper surfaces of the second ground layers exposed from the second openings of the third insulating layer and on the upper surface of the third insulating layer (and on the inner side surfaces of the second openings) by chromium sputtering and copper sputtering. Next, a plating resist was formed in a pattern reverse to the pattern of third ground layers on the upper surface of the third metal thin film. Then, in accordance with the additive method, the third ground layers each made of copper and integrally including a second upper portion (upper ground layer) having a thickness of 12 μm and a width of 300 μm and a second lower portion (side ground layer) having a thickness of 12 μm and a width of 40 μm were formed by electrolytic copper plating on the second ground layers and the third insulating layer. Thereafter, the plating resist and the portion of the third metal thin film where the plating resist was laminated were removed by chemical etching (see FIG. 4(g)).

The spacing between the individual third ground layers was 140 μm.

Next, a varnish of a photosensitive polyamic acid resin was coated on the upper surface of the third insulating layer including the third ground layers, dried, exposed to light via a photomask, developed, and cured by heating to form a fourth insulating layer having a thickness of 12 μm in the foregoing pattern on the third insulating layer so as to cover the third ground layers (see FIG. 4(h)).

Next, by dry etching using a laser, a plurality of slits having round holes formed at the both longitudinal ends thereof were formed between the respective signal wirings in the insulating layers along the longitudinal direction over the proximity of the respective display-side connecting terminals, and the proximity of the respective operation-side connecting terminals (see FIG. 4(i)).

The width of each of the slits halfway in the longitudinal direction was 40 μm. The spacing between the individual slits was 0.5 mm. The diameter of each of the round holes was 75 μm. The spacing between the one longitudinal end edge of each of the round holes and the one longitudinal end edge of each of the third insulating layer and the fourth insulating layer at the one longitudinal end was 0.5 mm, which was the same as the spacing between the other longitudinal end edge of each of the round holes and the other longitudinal end edge of each of the third insulating layer and the fourth insulating layer at the other longitudinal end.

Next, the metal supporting board was removed by chemical etching using an ferric chloride aqueous solution (see FIG. 4(j)), whereby a flexible wired circuit board was produced (see FIG. 1). The thickness of the flexible wired circuit board was 216 μm.

The flexible wired circuit board was placed around the connecting member of a cellular phone including a display-side casing, an operation-side casing, and the connecting member by which the display-side casing and the operation-side casing were connected to be rotatable in a circumferential direction around a rotation shaft as the center of rotation. Then, the respective signal wirings and slits of the flexible wired circuit board were arranged parallel along the direction of rotation of the rotation shaft of the connecting member (see FIGS. 5 and 6). Additionally, the display-side connecting terminals of the flexible wired circuit board were connected to the connectors of the display-side electronic component of the display-side casing of the cellular phone, while the operation-side connecting terminals of the flexible wired circuit board were connected to the connectors of the operation-side electronic component of the operation-side casing of the cellular phone.

Then, even after the display-side casing and the operation-side casing were rotated 100000 times in the circumferential direction around the rotation shaft as the center of rotation, the breakage of the signal wiring did not occur.

Comparative Example 1

A flexible wired circuit board was produced in the same manner as in EXAMPLE 1 except that slits were not formed. Subsequently, the flexible wired circuit board was disposed at the connecting member of a cellular phone.

Then, after the display-side casing and the operation-side casing were rotated 20000 times in the circumferential direction around the rotation shaft as the center of rotation, the breakage of the signal wiring occurred.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
a base insulating layer extending in a longitudinal direction and forming a first insulating layer;
a second insulating layer formed on top of the first insulating layer;
a conductive layer having a plurality of signal wirings formed on the second insulating layer and in mutually spaced-apart and parallel relation in a perpendicular direction to the longitudinal direction and a thickness direction of the base insulating layer and the second insulating layer, and connecting terminals provided on both longitudinal ends of each of the signal wirings;

a ground layer formed to surround each of the signal wirings in a perpendicular direction to the longitudinal direction, with a lower surface of the ground layer being formed on a top surface of the base insulating layer; and a cover insulating layer extending in the longitudinal direction and which covers the conductive layer and the ground layer, the cover insulating layer being shorter in the longitudinal direction than the base insulating layer and the second insulating layer, such that the connecting terminals provided on both longitudinal ends of each of the signal wirings are exposed from the cover insulating layer, wherein a slit along the longitudinal direction is formed between each of the signal wirings and penetrates completely through the base insulating layer, the second insulating layer, and the cover insulating layer in the thickness direction, and wherein the slit is formed to extend adjacent to each of the connecting terminals on one side in the longitudinal direction, and adjacent to each of the connecting terminals on the other side in the longitudinal direction.

2. The wired circuit board according to claim 1, wherein the slit has round holes disposed at both longitudinal ends thereof to outwardly protrude in a widthwise direction.

3. The wired circuit board according to claim 1, wherein both longitudinal ends of the slit respectively extend proximate to an edge of the cover insulating layer on the one side in the longitudinal direction and on the other side in the longitudinal direction, such that the slit is not formed where the connecting terminals provided on both longitudinal ends of each of the signal wirings are exposed from the cover insulating layer.

4. The wired circuit board according to claim 1, wherein the cover insulating layer comprises a third insulating layer and a fourth insulating layer.

5. An electronic device comprising:
a first casing;
a second casing connected to the first casing;
a connecting member for connecting the first casing and the second casing so as to be relatively rotatable; and
a wired circuit board comprising:
   a base insulating layer extending in a longitudinal direction and forming a first insulating layer,
   a second insulating layer formed on top of the first insulating layer,
   a conductive layer having a plurality of signal wirings formed on the second insulating layer and in mutually spaced-apart and parallel relation in a perpendicular direction to the longitudinal direction and a thickness direction of the base insulating layer and the second insulating layer, and connecting terminals provided on both longitudinal ends of each of the signal wirings,
   a ground layer formed to surround each of the signal wirings in a perpendicular direction to the longitudinal direction, with a lower surface of the ground layer being formed on a top surface of the base insulating layer, and
   a cover insulating layer extending in the longitudinal direction and which covers the conductive layer and the ground layer, the cover insulating layer being shorter in the longitudinal direction than the base insulating layer and the second insulating layer, such that the connecting terminals provided on both longitudinal ends of each of the signal wirings are exposed from the cover insulating layer, the base insulating layer and the cover insulating layer being formed with a slit between each of the signal wirings along the longitudinal direction, the slit penetrating completely through the base insulating layer, the second insulating layer, and the cover insulating layer in the thickness direction, and the slit being formed to extend adjacent to each of the connecting terminals on one side in the longitudinal direction, and adjacent to each of the connecting terminals on the other side in the longitudinal direction, wherein:
      each of the connecting terminals on one side in a longitudinal direction is connected to an electronic component of the first casing;
      each of the connecting terminals on the other side in the longitudinal direction is connected to an electronic component of the second casing; and
      each of the signal wirings is disposed around the connecting member and is arranged parallel along a direction in which the first casing and the second casing relatively rotate.

6. A wired circuit board comprising:
an insulating layer extending in a longitudinal direction;
a conductive layer having a plurality of signal wirings covered with the insulating layer and in mutually spaced-apart and parallel relation in a perpendicular direction to the longitudinal direction and a thickness direction of the insulating layer, and connecting terminals provided on both longitudinal ends of each of the signal wirings and exposed from the insulating layer; and
a ground layer covered with the insulating layer and formed to surround each of the signal wirings in a perpendicular direction to the longitudinal direction,
wherein a slit along the longitudinal direction is formed between each of the signal wirings in the insulating layer,
wherein the slit is formed to extend adjacent to each of the connecting terminals on one side in the longitudinal direction, and adjacent to each of the connecting terminals on the other side in the longitudinal direction, and
wherein the slit has round holes disposed at both longitudinal ends thereof to outwardly protrude in a widthwise direction.

* * * * *